US012811090B2

(12) United States Patent
Sato

(10) Patent No.: US 12,811,090 B2
(45) Date of Patent: Nov. 24, 2026

(54) UPPER ELECTRODE STRUCTURE AND PLASMA PROCESSING APPARATUS

(71) Applicant: Tokyo Electron Limited, Tokyo (JP)

(72) Inventor: Tetsuji Sato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 294 days.

(21) Appl. No.: 18/628,269

(22) Filed: Apr. 5, 2024

(65) Prior Publication Data

US 2024/0249907 A1 Jul. 25, 2024

Related U.S. Application Data

(63) Continuation of application No. PCT/JP2022/035608, filed on Sep. 26, 2022.

(30) Foreign Application Priority Data

Oct. 5, 2021 (JP) ................................ 2021-164043

(51) Int. Cl.
*H01J 37/20* (2006.01)
*H01J 37/32* (2006.01)

(52) U.S. Cl.
CPC ........ *H01J 37/20* (2013.01); *H01J 37/32522* (2013.01); *H01J 37/32568* (2013.01); *H01J 37/32577* (2013.01)

(58) Field of Classification Search
CPC ................ H01J 37/20; H01J 37/32522; H01J 37/32568; H01J 37/32577
See application file for complete search history.

(56) References Cited

U.S. PATENT DOCUMENTS

| | | | |
|---|---|---|---|
| 2014/0083361 | A1 | 3/2014 | Rocha-Alvarez et al. |
| 2017/0069470 | A1 | 3/2017 | Murakami et al. |
| 2020/0107429 | A1 | 4/2020 | Uchida et al. |

FOREIGN PATENT DOCUMENTS

| | | | | |
|---|---|---|---|---|
| JP | 2001085398 | A | * | 3/2001 |
| JP | 2008205415 | A | * | 9/2008 |
| JP | 2009-212340 | A | | 9/2009 |
| JP | 2010-514160 | A | | 4/2010 |

(Continued)

OTHER PUBLICATIONS

International Search Report and Written Opinion mailed on Nov. 22, 2022, received for PCT Application PCT/JP2022/035608, filed on Sep. 26, 2022, 11 pages including English Translation.

*Primary Examiner* — Andrew Smyth
(74) *Attorney, Agent, or Firm* — XSENSUS LLP

(57) ABSTRACT

A plasma processing apparatus comprises a plasma processing chamber, a substrate support disposed in the plasma processing chamber and including a lower electrode, an upper electrode structure disposed above the substrate support. The upper electrode structure includes a cooling plate having a coolant channel, an electrode plate disposed below the cooling plate, and an electrostatic attracting film formed on a bottom surface of the cooling plate and configured to electrostatically attract the electrode plate. The electrostatic attracting film has a dielectric portion and at least one conductor portion disposed in the dielectric portion. The plasma processing apparatus further comprises a power supply electrically connected to the at least one conductor portion.

13 Claims, 6 Drawing Sheets

(56) References Cited

FOREIGN PATENT DOCUMENTS

| | | | | | |
|---|---|---|---|---|---|
| JP | 2015-536043 | A | | 12/2015 | |
| JP | 2020-057696 | A | | 4/2020 | |
| JP | 2020115419 | A | * | 7/2020 | .......... H01J 37/3244 |
| WO | 2008/076408 | A1 | | 6/2008 | |
| WO | 2014/052301 | A1 | | 4/2014 | |

* cited by examiner

UPPER ELECTRODE STRUCTURE AND PLASMA PROCESSING APPARATUS

CROSS-REFERENCE TO RELATED APPLICATIONS

This application is a bypass continuation application of International Application No. PCT/JP2022/035608 having an international filing date of Sep. 26, 2022 and designating the United States, the International Application being based upon and claiming the benefit of priority from Japanese Patent Application No. 2021-164043 filed on Oct. 5, 2021, the entire contents of each are incorporated herein by reference.

TECHNICAL FIELD

Exemplary embodiments of the present disclosure relate to an upper electrode structure and a plasma processing apparatus.

BACKGROUND

Japanese Laid-open Patent Publication No. 2020-115419 discloses an electrostatic chuck that attracts an electrode plate on an upper electrode of a plasma processing apparatus. The electrostatic chuck is disposed between an electrode plate and a gas plate. An upper surface of the electrostatic chuck is a contact surface to be in contact with a bottom surface of the gas plate, and the electrostatic chuck is fixed to the bottom surface of the gas plate by an adhesive or the like. The bottom surface of the electrostatic chuck is an attracting surface that attracts the upper surface of the electrode plate.

SUMMARY

The present disclosure provides a technique capable of efficiently cooling an electrode plate.

In accordance with an exemplary embodiment, there is provided a plasma processing apparatus. The plasma processing apparatus comprises a plasma processing chamber, a substrate support, an upper electrode structure and a power supply. The substrate support is disposed in the plasma processing chamber and includes a lower electrode. The upper electrode structure is disposed above the substrate support. The upper electrode structure includes a cooling plate, an electrode plate, and an electrostatic attracting film. The cooling plate has a coolant channel. The electrode plate is disposed below the cooling plate. The electrostatic attracting film is formed on a bottom surface of the cooling plate and configured to electrostatically attract the electrode plate. The electrostatic attracting film has a dielectric portion and at least one conductor portion disposed in the dielectric portion. The power supply is electrically connected to the at least one conductor portion.

DETAILED DESCRIPTION

Figure 1:
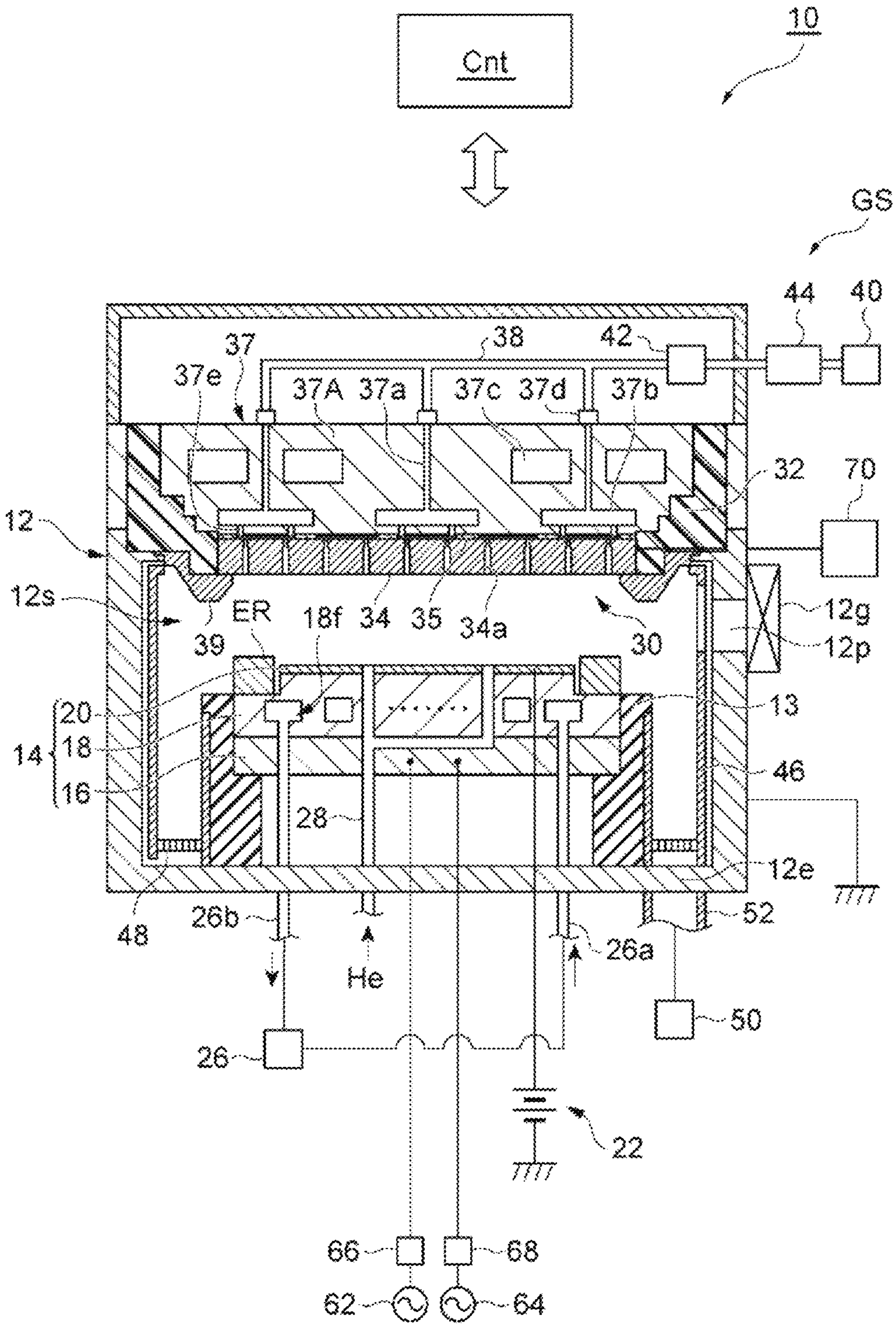
FIG. 1 schematically shows a plasma processing apparatus according to one exemplary embodiment.

Hereinafter, various exemplary embodiments will be described.

In one exemplary embodiment, an upper electrode structure of a plasma processing apparatus is provided. The upper electrode structure includes an electrode plate and a cooling plate. The electrode plate has gas injection holes penetrating therethrough in a thickness direction. The cooling plate holds the electrode plate. The cooling plate has a cooling plate main body and an electrostatic attracting portion. The cooling plate main body has a channel therein through which a coolant flows, and a gas channel for supplying a processing gas to the gas injection holes is formed to extend in the thickness direction. The electrostatic attracting portion is integrally formed in direct contact with the cooling plate main body, and is interposed between the electrode plate and the cooling plate main body.

In the upper electrode structure, the electrostatic attracting portion for attracting the electrode plate is integrally formed in direct contact with the cooling plate main body. Therefore, the heat of the electrode plate is effectively conducted to the cooling plate compared to when the electrostatic attracting porting is fixed to the cooling plate main body by an adhesive or the like. Therefore, the upper electrode structure can efficiently cool the electrode plate.

In one exemplary embodiment, the electrostatic attracting portion may include a conductive member disposed in a dielectric member formed by thermal spraying. In this case, the electrostatic attracting portion is integrally formed in direct contact with the cooling plate.

In one exemplary embodiment, the electrostatic attracting portion may have a plurality of protrusions to be in contact with the upper surface of the electrode plate. In this case, a space is formed between the electrostatic attracting portion and the upper surface of the electrode plate. Therefore, in the upper electrode structure, the electrode plate can be more effectively cooled by introducing a gas into the space formed between the electrostatic attracting portion and the electrode plate, for example.

In one exemplary embodiment, the electrostatic attracting portion may have an annular protrusion surrounding all the plurality of protrusions. In this case, for example, even if the gas introduced into the space formed between the electrostatic attracting portion and the electrode plate attempts to move away from the plurality of protrusions, it is blocked by the annular protrusion and remains in the space formed between the electrostatic attracting portion and the upper electrode. Therefore, the upper electrode structure can more effectively cool the electrode plate.

In one exemplary embodiment, the conductor member may be divided into a plurality of parts when viewed in the thickness direction. In this case, the electrostatic attracting portion can control the attractive force for each divided conductor member. The conductor member may be divided concentrically. In this case, the electrostatic attracting portion can achieve uniform attractive force in the in-plane direction with respect to the center of the concentric circles. The electrostatic attracting portion may have a plurality of regions corresponding to the plurality of divided conductor members, and the density of the protrusions may be different in the plurality of regions. In this case, the electrostatic attracting portion can have different cooling efficiencies for each region corresponding to each divided conductor member.

In one exemplary embodiment, the gas channel may be formed at a position that does not overlap the gas injection holes when viewed in the thickness direction. When radicals or the like move linearly from a chamber toward the gas channel, the radicals collide with the electrostatic attracting portion, thereby avoiding direct inflow of the radicals into the gas channel. Therefore, the upper electrode structure can suppress abnormal discharge caused by plasma.

In one exemplary embodiment, the conductor member may be at least one of alumina and aluminum nitride.

In one exemplary embodiment, the cooling plate main body may have therein a gas diffusion space and a coolant channel. In this case, the cooling plate can cool the upper electrode using a coolant. In one exemplary embodiment, the coolant channel may be disposed such that the distance to the bottom surface of the cooling plate main body is shorter than the distance to the upper surface of the cooling plate main body. In this case, the coolant channel is disposed near the electrode plate, so that the cooling plate can effectively cool the electrode plate. In one exemplary embodiment, a heater may be disposed at a periphery of the cooling plate main body. In this case, the temperature of the cooling plate can be controlled by heating the heater. In one exemplary embodiment, the upper electrode structure may include a support member for supporting the electrode plate. A locking portion of the support member with the electrode plate may be configured to be rotatable downward.

In another exemplary embodiment, a plasma processing apparatus is provided. The plasma processing apparatus includes a chamber, a substrate support, and an upper electrode structure. The substrate support is configured to support the substrate in the chamber. The upper electrode structure constitutes an upper part of the chamber. The upper electrode structure includes an electrode plate and a cooling plate. The electrode plate has gas injection holes penetrating therethrough in the thickness direction. The cooling plate holds the electrode plate. The cooling plate has a cooling plate main body and an electrostatic attracting portion. The cooling plate main body has a channel therein through which a coolant flows, and a gas channel for supplying a processing gas to the gas injection holes is formed to extend in the thickness direction. The electrostatic attracting portion is integrally formed in direct contact with the cooling plate main body, and is interposed between the electrode plate and the cooling plate main body.

In the upper electrode structure, the electrostatic attracting portion for attracting the electrode plate is integrally formed in direct contact with the cooling plate main body. Therefore, the heat of the electrode plate is effectively conducted to the cooling plate compared to when the electrostatic attracting portion is fixed to the cooling plate main body by an adhesive or the like. Therefore, the upper electrode structure can efficiently cool the electrode plate.

Outline of Plasma Processing Apparatus

FIG. 1 schematically shows a plasma processing apparatus according to one exemplary embodiment. A plasma processing apparatus 10 shown in FIG. 1 is a capacitively coupled plasma etching apparatus. The plasma processing apparatus 10 includes a chamber main body 12 (an example of a plasma processing chamber). The chamber main body 12 has a substantially cylindrical shape, and has an inner space 12*s*. The chamber main body 12 is made of aluminum, for example. The inner wall surface of the chamber main body 12 is processed to have plasma resistance. For example, the inner wall surface of the chamber main body 12 is anodically oxidized. The chamber main body 12 is electrically grounded.

A passage 12*p* is formed in the sidewall of the chamber main body 12. An object to be processed passes through the passage 12*p* when it is loaded into and unloaded from the inner space 12*s*. The passage 12*p* can be opened and closed by a gate valve 12*g*.

A support 13 is disposed on a bottom portion of the chamber main body 12. The support 13 is made of an insulating material. The support 13 has a substantially cylindrical shape. The support 13 extends vertically from the bottom portion of the chamber main body 12 in the inner space 12*s*. The support 13 supports a stage 14 (an example of a substrate support). The stage 14 is disposed in the inner space 12*s*.

The stage 14 has a lower electrode 18 and an electrostatic chuck 20. The stage 14 may further include an electrode plate 16. The electrode plate 16 is made of a conductive material such as aluminum, and has a substantially disc shape. The lower electrode 18 is disposed on the electrode plate 16. The lower electrode 18 is made of a conductive material such as aluminum, and has a substantially disc shape. The lower electrode 18 is electrically connected to the electrode plate 16.

The electrostatic chuck 20 is disposed on the lower electrode 18. The object to be processed is placed on the upper surface of the electrostatic chuck 20. The electrostatic chuck 20 has a main body made of a dielectric material. A film-shaped electrode is disposed in the main body of the electrostatic chuck 20. The electrode of the electrostatic chuck 20 is connected to a power supply 22 via a switch. The power supply 22 may be a DC power supply or an AC power supply. When a voltage from the power supply 22 is applied to the electrode of the electrostatic chuck 20, the electrostatic attractive force is generated between the electrostatic chuck 20 and the object to be processed. Due to the electrostatic attractive force thus generated, the object to be processed is attracted to and held by the electrostatic chuck 20.

An edge ring ER is disposed on the stage 14 to surround the edge of the object to be processed. The edge ring ER is provided to improve the in-plane uniformity of etching. The edge ring ER may be made of silicon, silicon carbide, quartz, or the like.

A channel 18*f* is disposed in the lower electrode 18. A coolant is supplied to the channel 18*f* from a chiller unit 26 disposed outside the chamber main body 12 through a line 26*a*. The coolant supplied to the channel 18*f* is returned to the chiller unit 26 through a line 26*b*. In the plasma processing apparatus 10, the temperature of the object to be processed placed on the electrostatic chuck 20 is adjusted by heat exchange between the coolant and the lower electrode 18.

The plasma processing apparatus 10 is provided with a gas supply line 28. The gas supply line 28 supplies a heat transfer gas, such as He gas, from a heat transfer gas supply mechanism to the gap between the top surface of the electrostatic chuck 20 and the backside of the object to be processed.

The plasma processing apparatus 10 further includes an upper electrode 30 (an example of an upper electrode structure). The upper electrode 30 is disposed above the stage 14. The upper electrode 30 includes an electrode plate 34. The bottom surface of the electrode plate 34 faces the inner space 12*s*, and defines the inner space 12*s*. The electrode plate 34 may be made of a low electrical resistance conductor or semiconductor that generates little Joule heat. The electrode plate 34 is made of silicon, for example. A plurality of gas injection holes 34*a* are formed in the electrode plate 34. The plurality of gas injection holes 34*a* penetrate through the electrode plate 34 in a thickness direction thereof.

A cooling plate 37 for holding the electrode plate 34 is disposed above the electrode plate 34. The cooling plate 37 includes a cooling plate main body 37A. The cooling plate main body 37A may be made of a conductive material such as aluminum. The cooling plate 37 has an electrostatic chuck 35 (an example of an electrostatic attracting film) on the bottom surface of the cooling plate main body 37A. The configuration of the electrostatic chuck 35 will be described later. Due to the attractive force of the electrostatic chuck 35, the electrode plate 34 is brought into close contact with the cooling plate main body 37A. The electrode plate 34 is supported at the upper part of the chamber main body 12 by the attractive force of the electrostatic chuck 35. A member 32 and a locking portion 39 (an example of a support member) are support members for supporting the electrode plate 34 from the bottom and preventing the electrode plate 34 from falling. The member 32 and the locking portion 39 are made of, e.g., an insulating material. The locking portion 39 may be configured to be rotatable downward.

A channel 37*c* (an example of a coolant channel) is disposed in the cooling plate main body 37A. A coolant is supplied to the channel 37*c* from a chiller unit (not shown) disposed outside the chamber main body 12. The coolant supplied to the channel 37*c* is returned to the chiller unit. Accordingly, the temperature of the cooling plate main body 37A is adjusted. In the plasma processing apparatus 10, the temperature of the electrode plate 34 is adjusted by heat exchange with the cooling plate main body 37A.

A plurality of gas inlet paths 37*a* (an example of a first gas channel) are disposed in the cooling plate main body 37A to extend downward. A plurality of gas diffusion spaces 37*b* are disposed between the upper surface of the electrode plate 34 and the bottom surface of the cooling plate main body 37A to correspond to the plurality of gas inlet paths 37*a*. A plurality of gas supply channels 37*e* (an example of second gas channels) are disposed to extend in the thickness direction from the gas diffusion space 37*b* toward the electrode plate 34. The gas supply channel 37*e* supplies a processing gas to the plurality of gas injection holes 34*a* of the electrode plate 34. A plurality of gas inlet ports 37*d* are formed in the cooling plate main body 37A to introduce a processing gas into the plurality of gas diffusion spaces 37*b*. A gas supply line 38 is connected to the gas inlet ports 37*d*.

A gas supply part GS is connected to the gas supply line 38. In one embodiment, the gas supply part GS includes a gas source group 40, a valve group 42, and a flow rate controller group 44. The gas source group 40 is connected to the gas supply line 38 via the flow rate controller group 44 and the valve group 42. The gas source group 40 includes a plurality of gas sources. The plurality of gas sources includes a plurality of sources of gases forming the processing gas used in a method MT. The valve group 42 includes a plurality of opening/closing valves. The flow rate controller group 44 includes a plurality of flow rate controllers. Each of the plurality of flow rate controllers is a mass flow controller or a pressure-controlled flow rate controller. The plurality of gas sources in the gas source group 40 are connected to the gas supply line 38 via corresponding valves in the valve group 42 and corresponding flow rate controllers in the flow rate controller group 44.

In the plasma processing apparatus 10, a shield 46 is detachably disposed along the inner wall of the chamber main body 12. The shield 46 is also disposed on an outer periphery of the support 13. The shield 46 prevents etching by-products from being adhered to the chamber main body 12. The shield 46 is formed by coating a member made of aluminum with ceramic such as $Y_2O_3$, for example.

A baffle plate 48 is disposed between the support 13 and the sidewall of the chamber main body 12. The baffle plate 48 is formed by coating a member made of aluminum with ceramic such as $Y_2O_3$, for example. A plurality of through-holes are formed in the baffle plate 48. An exhaust port 12*e* is disposed below the baffle plate 48 and at the bottom portion of the chamber main body 12. An exhaust device 50 is connected to the exhaust port 12*e* through an exhaust line 52. The exhaust device 50 includes a pressure control valve and a vacuum pump such as a turbo molecular pump.

The plasma processing apparatus 10 further includes a first radio frequency (RF) power supply 62 and a second RF power supply 64. The first RF power supply 62 generates a first high frequency power (RF power) for plasma generation. The frequency of the first RF power is, e.g., within a range of 27 MHz to 100 MHz. The first RF power supply 62 is connected to the lower electrode 18 via a matching device 66 and the electrode plate 16. The matching device 66 has a circuit for matching the output impedance of the first RF power supply 62 and the input impedance on the load side (the lower electrode 18 side). The first RF power supply 62 may be connected to the upper electrode 30 via the matching device 66.

The second RF power supply 64 generates a second high frequency power (another RF power) for attracting ions into the object to be processed. The frequency of the second RF power is lower than the frequency of the first RF power. The frequency of the second RF power is, e.g., within a range of 400 kHz to 13.56 MHz. The second RF power supply 64 is connected to the lower electrode 18 via a matching device 68 and the electrode plate 16. The matching device 68 has a circuit for matching the output impedance of the second RF power supply 64 and the input impedance on the load side (the lower electrode 18 side).

The plasma processing apparatus 10 may further include a DC power supply part 70 (an example of a DC power supply). The DC power supply part 70 is connected to the upper electrode 30. The DC power supply part 70 can generate a negative DC voltage and apply the DC voltage to the upper electrode 30.

The plasma processing apparatus 10 may further include a controller Cnt. The controller Cnt may be a computer including a processor, a storage part, an input device, a display device, or the like. The controller Cnt controls individual components of the plasma processing apparatus 10. In the controller Cnt, an operator can input commands to manage the plasma processing apparatus 10 using the input device. Further, in the controller Cnt, the operating status of the plasma processing apparatus 10 can be visualized and displayed using the display device. Further, the storage part of the controller Cnt stores control programs and recipe data for controlling various processes executed by the plasma processing apparatus 10 by the processor. The processor of the controller Cnt executes the control program and controls the individual components of the plasma processing apparatus 10 based on the recipe data, so that a method to be described later is executed in the plasma processing apparatus 10.

Outline of Upper Electrode Structure

Figure 2:
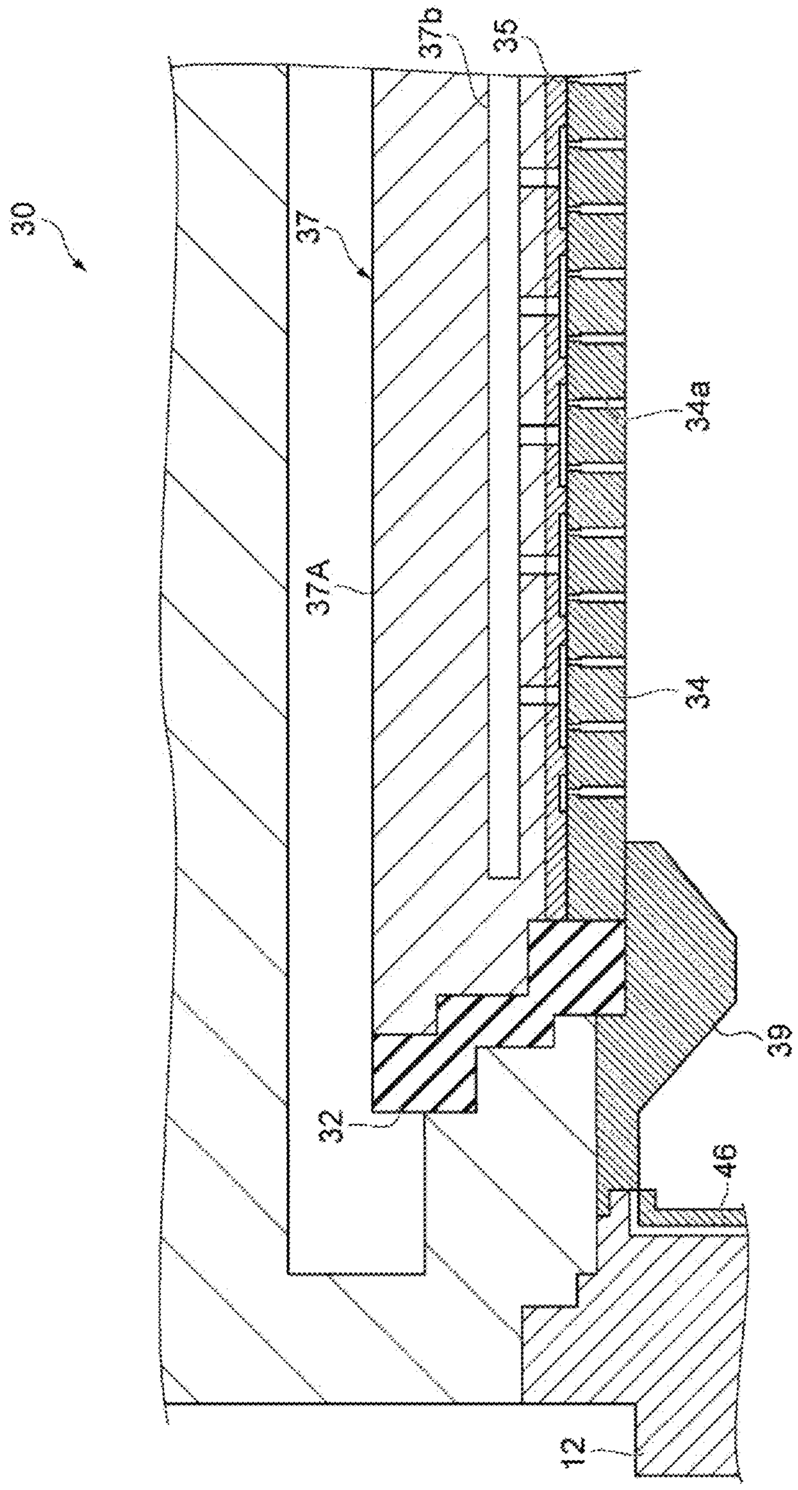
FIG. 2 is a cross-sectional view of an upper electrode according to one exemplary embodiment.

FIG. 2 is a cross-sectional view of an upper electrode according to one exemplary embodiment. As shown in FIG. 2, the upper electrode 30 has a structure in which the electrode plate 34 and the cooling plate 37 are stacked in that order from the bottom. The electrostatic chuck 35 is integrally formed on the bottom surface of the cooling plate main body 37A to be in direct contact with the cooling plate main body 37A. For example, the electrostatic chuck 35 is formed on the cooling plate 37 by thermal spraying. The bottom surface of the electrostatic chuck 35 serves as an attracting surface that attracts the upper surface of the electrode plate 34. As described above, the electrostatic chuck 35 is interposed between the electrode plate 34 and the cooling plate 37.

Figure 3:
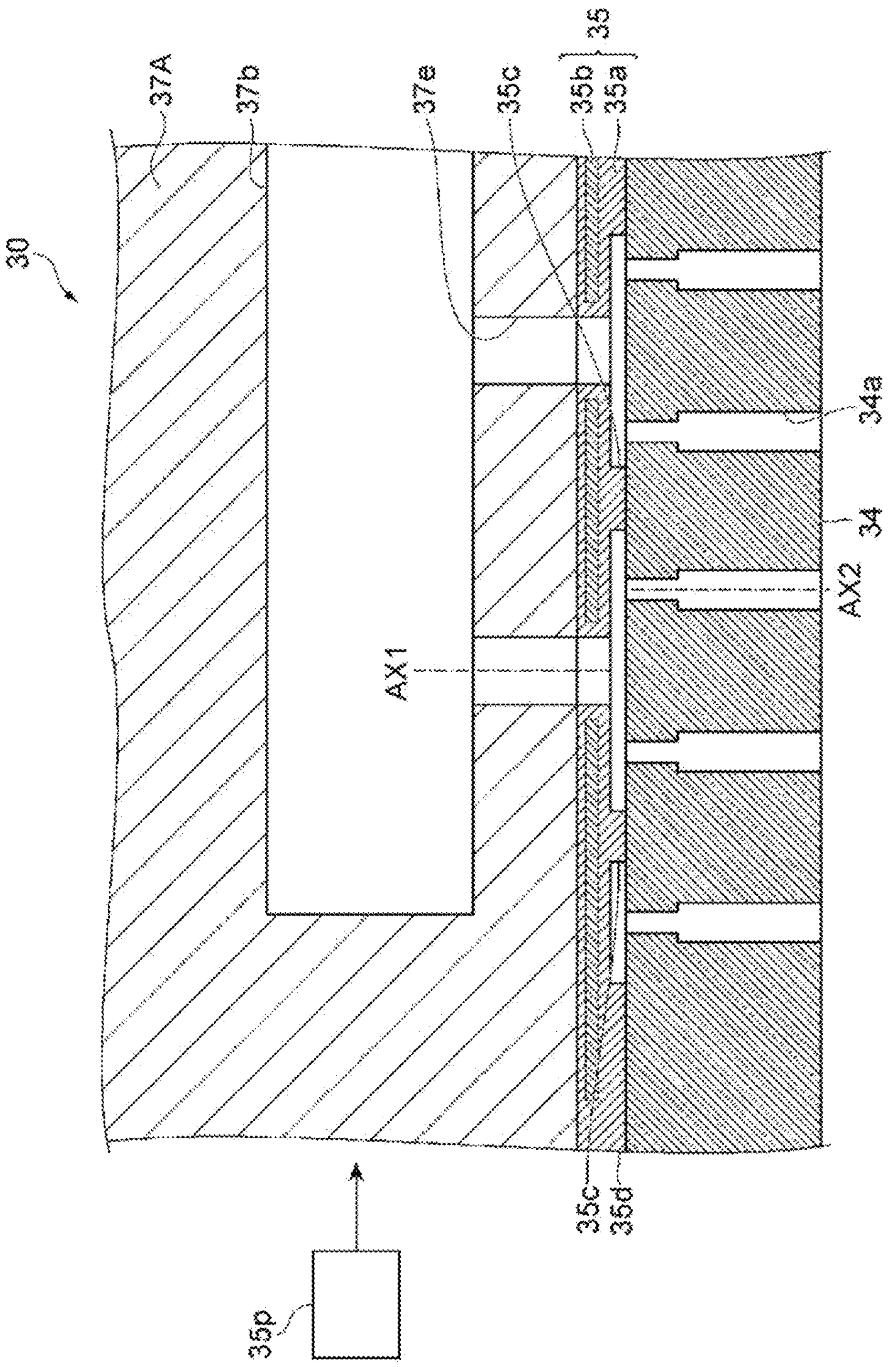
FIG. 3 is a cross-sectional view specifically showing an upper electrode according to one exemplary embodiment.

FIG. 3 is a cross-sectional view specifically showing the upper electrode according to one exemplary embodiment. As shown in FIG. 3, the electrostatic chuck 35 has a main body 35*a* (an example of a dielectric portion) made of a dielectric material. The dielectric is at least one of alumina ($Al_2O_3$) and aluminum nitride (AlN). At least one electrode 35*b* (an example of a conductive portion) is disposed in the main body 35*a*. In other words, the electrostatic chuck 35 has the electrode 35*b* in the main body 35*a* formed by thermal spraying. The electrode 35*b* is electrically connected to a power supply 35*p*. The power supply 35*p* may be a DC power supply or an AC power supply. When a voltage from the power supply 35*p* is applied to the electrode 35*b* of the electrostatic chuck 35, the electrostatic attractive force is generated between the electrostatic chuck 35 and the electrode plate 34. Due to the electrostatic attractive force thus generated, the electrode plate 34 is attracted to and held by the electrostatic chuck 35.

The electrostatic chuck 35 has, at positions corresponding to the gas supply channels 37*e* of the cooling plate 37, through-holes penetrating therethrough in the thickness direction. Accordingly, the processing gas in the gas diffusion space 37*b* passes through the gas supply channels 37*e*, and is supplied to the upper surface of the electrode plate 34 through the through-holes of the electrostatic chuck 35.

A plurality of protrusions 35*c* (an example of dot-shaped protrusions) are formed on the bottom surface (attracting surface) of the electrostatic chuck 35. Therefore, not the entire surface of the electrostatic chuck 35 is in close contact with the electrode plate 34, but only the tip surfaces of the plurality of protrusions 35*c* are in contact with the upper surface of the electrode plate 34. The plurality of protrusions 35*c* form a dot pattern, for example. Further, an annular protrusion 35*d* surrounding all the plurality of protrusions 35*c* may be disposed at the outermost periphery of the plurality of protrusions 35*c*.

The above-described through-holes are formed between the plurality of protrusions 35*c* of the electrostatic chuck 35. In other words, the gas supply channels 37*e* are provided at positions that do not overlap the plurality of protrusions 35*c* when viewed in the thickness direction of the cooling plate main body 37A. Further, the gas supply channels 37*e* are formed at positions that do not overlap the gas injection holes 34*a* of the electrode plate 34 when viewed in the thickness direction of the cooling plate main body 37A. In other words, a first axis AX1 of the gas supply channel 37*e* and a second axis AX2 of the gas injection hole 34*a* are offset from each other. Accordingly, the processing gas supplied from the gas supply channels 37*e* is once collected between the plurality of protrusions 35*c* of the electrostatic chuck 35, and then injected from the gas injection holes 34*a*. Due to the offset structure, it is possible to physically prevent radicals or gases in the inner space 12*s* from moving from the gas injection holes 34*a* to the gas supply channels 37*e* of the cooling plate 37. Hence, the offset structure can suppress occurrence of abnormal discharge in the gas supply channels 37*e* of the cooling plate 37.

The electrode 35*b* may be concentrically divided into a plurality of parts when viewed in the thickness direction of the cooling plate main body 37A. For example, the electrode 35*b* includes a center electrode disposed at the center and outer edge electrodes disposed to surround the center electrode. The power supply is connected to each of the center electrode and the outer edge electrodes. Accordingly, different attractive forces are exerted in the center region and the outer edge region, and different temperature control operations are performed in the center region and the outer edge region. Further, the electrostatic chuck 35 may have a plurality of regions corresponding to the plurality of divided electrodes 35*b*. Further, the density of the plurality of protrusions 35*c* may be different for each region.

Figure 4:
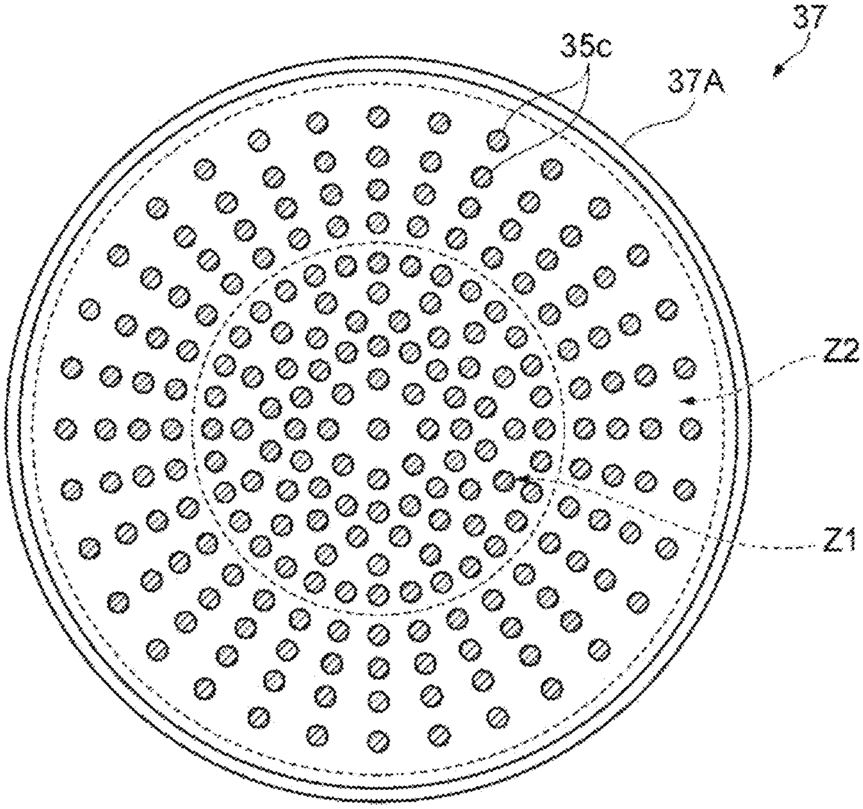
FIG. 4 shows a bottom surface of a cooling plate according to one exemplary embodiment.
Figure 5:
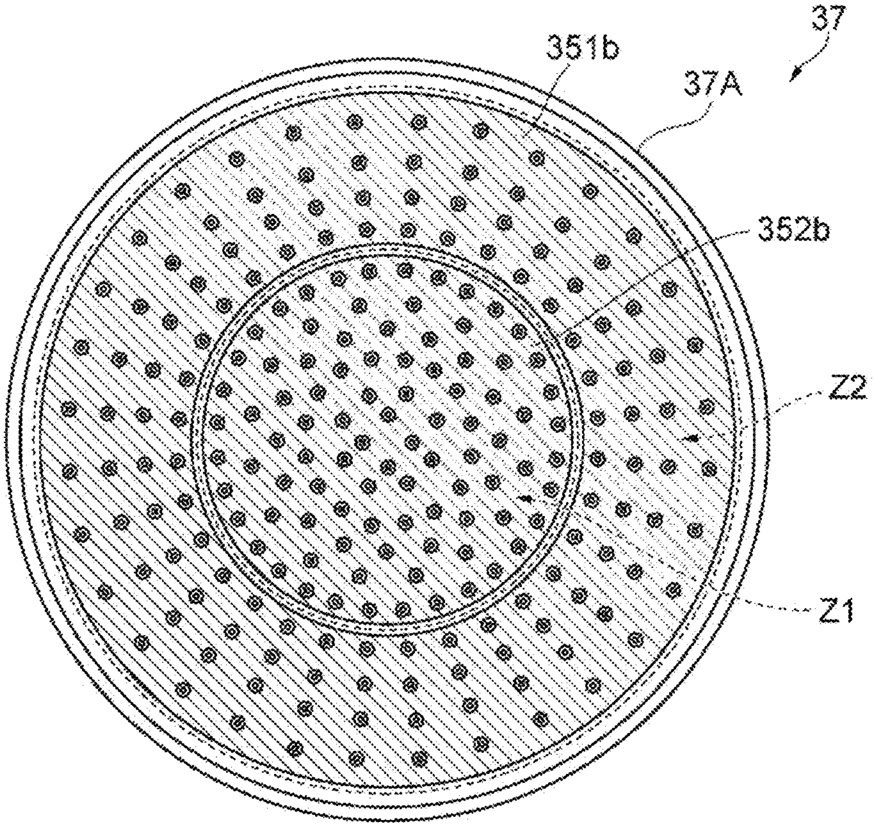
FIG. 5 shows an electrode of a cooling plate according to one exemplary embodiment.

FIG. 4 shows a bottom surface of a cooling plate according to one exemplary embodiment. FIG. 5 shows an electrode of a cooling plate according to one exemplary embodiment. As shown in FIG. 4, the electrostatic chuck 35 having the plurality of protrusions 35*c* is formed on the bottom surface of the cooling plate main body 37A. As shown in FIG. 5, the polarity of the voltage supplied to the center electrode 352*b* corresponding to a center region Z1 (an example of the first region) may be different from the polarity of the voltage supplied to the outer edge electrode 351*b* corresponding to an outer edge region Z2 (an example of the second region). In this case, the electrostatic chuck 35 attracts the electrode plate 34 in a bipolar manner. In the case of the bipolar method, a potential difference may exist between the center electrode 352*b* and the outer edge electrode 351*b*. The polarity of the voltage supplied to the center electrode 352*b* corresponding to the center region Z1 may be the same as the polarity of the voltage supplied to the outer edge electrode 351*b* corresponding to the outer edge region Z2. In this case, the electrostatic chuck 35 attracts the electrode plate 34 in a monopolar manner.

Method for Separating Electrode Plate

In the case of separating the electrode plate 34, the applied voltage of the power supply connected to the electrostatic chuck 35 is set to 0V, and the processing gas is outputted from the gas supply part GS. Accordingly, the electrode plate 34 is pressed in a direction away from the electrostatic chuck 35 by the pressure of the processing gas, so that the electrode plate 34 can be easily separated.

Summary of Exemplary Embodiments

In the upper electrode 30, the electrostatic chuck 35 for attracting the electrode plate 34 is integrally formed in direct contact with the cooling plate main body 37A by thermal spraying. Therefore, the heat of the electrode plate 34 is effectively conducted to the cooling plate main body 37A compared to when the electrostatic chuck 35 is fixed to the cooling plate main body 37A by an adhesive or the like. Hence, the upper electrode 30 can effectively cool the electrode plate 34.

In the upper electrode 30, the electrostatic chuck 35 has the plurality of protrusions 35*c* to be in contact with the upper surface of the electrode plate 34, so that a space is formed between the electrostatic chuck 35 and the upper surface of the electrode plate 34. The processing gas flows through the space formed between the electrostatic chuck 35 and the electrode plate 34, so that the electrode plate 34 can be cooled more effectively.

Since the plurality of protrusions 35*c* of the electrostatic chuck 35 form a dot pattern, the processing gas is uniformly diffused to the entire upper surface of the electrode plate 34. Therefore, the upper electrode 30 can cool the entire electrode plate 34 uniformly.

In the upper electrode 30, the gas supply channels 37*e* of the cooling plate 37 are formed at positions that do not overlap the gas injection holes 34*a* when viewed in the thickness direction. When radicals or the like move linearly from the chamber toward the gas supply channels 37*e*, the radicals collide with the electrostatic chuck 35. Therefore, the direct inflow of the radicals into the gas supply channels 37*e* can be avoided. Hence, the upper electrode 30 can suppress abnormal discharge caused by plasma.

Other Exemplary Embodiments

Figure 6:
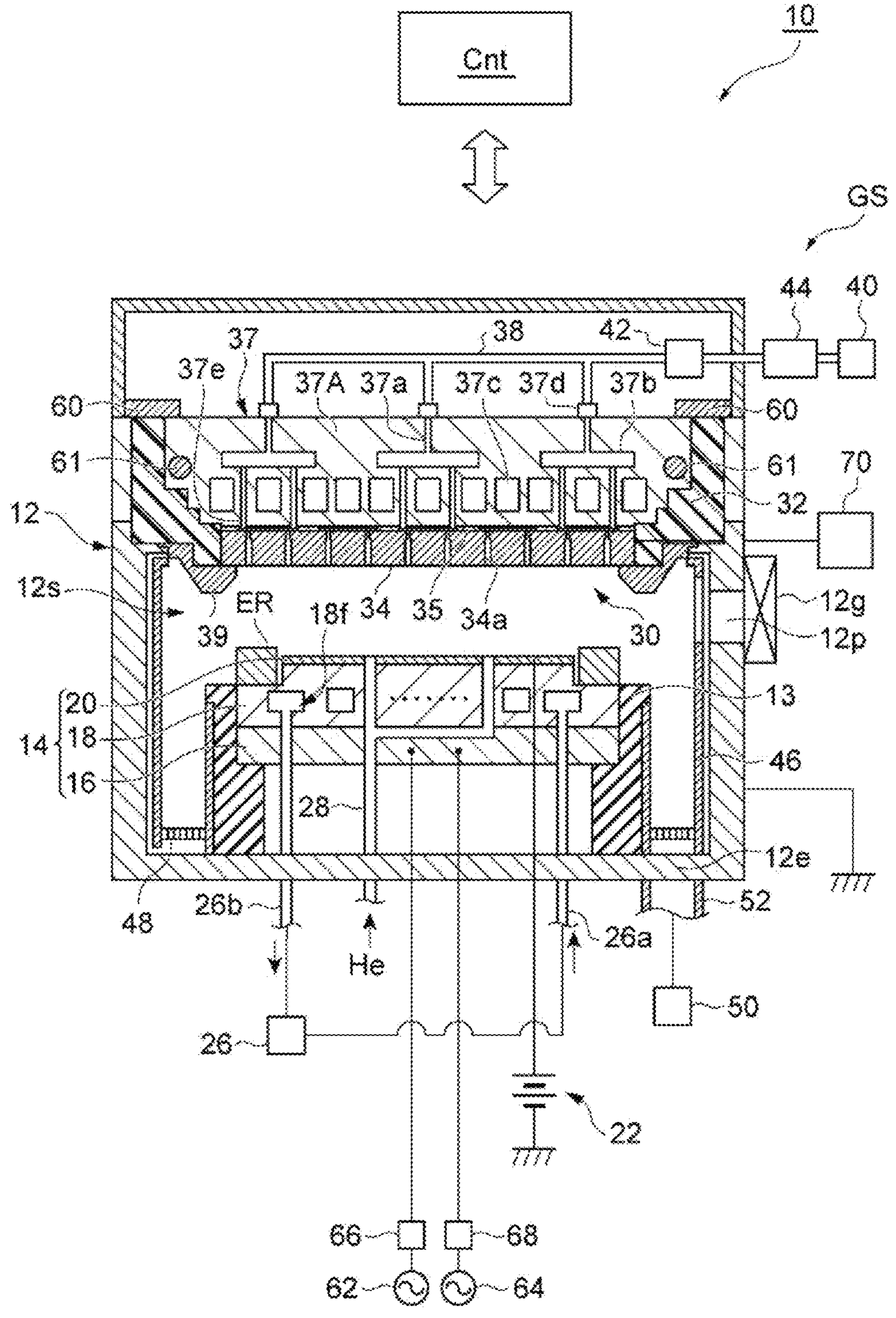
FIG. 6 schematically shows a plasma processing apparatus according to another exemplary embodiment.

FIG. 6 schematically showing a plasma processing apparatus according to another exemplary embodiment. The plasma processing apparatus 10 shown in FIG. 6 is the same as the plasma processing apparatus 10 shown in FIG. 1 except the arrangement of the channel 27C and the presence of heaters 60 and 61. Hereinafter, the differences will be mainly described, and redundant description will be omitted.

As shown in FIG. 6, the channel 37*c* is disposed at a position lower than the gas diffusion space 37*b*. The channel 37*c* is disposed such that the distance to the bottom surface of the cooling plate main body 37A is shorter than the distance to the top surface of the cooling plate main body 37A. Accordingly, the channel 37*c* is disposed near the electrode plate 34, so that the cooling effect can be enhanced.

The heater 60 is disposed on the upper surface of the cooling plate main body 37A. An example of the heater 60 is a seat heater. The heater 61 is disposed at the peripheral portion of the cooling plate main body 37A. An example of the heater 61 is a ceramic heater. By providing the heaters 60 and 61, the in-plane temperature uniformity of the electrode plate 34 can be improved.

While various exemplary embodiments have been described above, the present disclosure is not limited to the above-described embodiments, and various additions, omissions, substitutions and changes may be made. Further, other embodiments can be implemented by combining elements in different embodiments.

For example, the plasma processing apparatus 10 is a capacitively coupled plasma processing apparatus. However, a plasma processing apparatus according to another embodiment may be a different type of plasma processing apparatus. Such plasma processing apparatus may be any type of plasma processing apparatus. Such a plasma processing apparatus may be an inductively coupled plasma processing apparatus, or a plasma processing apparatus for generating plasma using surface waves such as microwaves.

Although an example of the plasma processing apparatus 10 in which two RF power supplies are connected to the lower electrode 18 and the DC power supply part 70 is connected to the upper electrode 30 has been described, the present disclosure is not limited thereto. For example, the plasma processing apparatus 10 may not include the upper electrode 30. For example, in the plasma processing apparatus 10, the RF power supply may be connected to the lower electrode 18 and the upper electrode 30. Further, the plasma processing apparatus 10 shown in FIG. 1 may include the heaters 60 and 61 shown in FIG. 6.

From the above description, it will be appreciated that various embodiments of the present disclosure have been described herein for purposes of illustration, and that various changes may be made without departing from the scope and spirit of the present disclosure. Therefore, the various embodiments disclosed herein are not intended to be limiting, with a true scope and spirit being indicated by the following claims.

The invention claimed is:

1. A plasma processing apparatus comprising:
a plasma processing chamber;
a substrate support disposed in the plasma processing chamber and including a lower electrode;
an upper electrode structure disposed above the substrate support,
wherein the upper electrode structure includes:
a cooling plate having a coolant channel;
an electrode plate disposed below the cooling plate; and
an electrostatic attracting film formed on a bottom surface of the cooling plate and configured to electrostatically attract the electrode plate, the electrostatic attracting film having a dielectric portion and at least one conductor portion disposed in the dielectric portion; and
a power supply electrically connected to the at least one conductor portion,
wherein the electrostatic attracting film has a plurality of dot-shaped protrusions to be in contact with an upper surface of the electrode plate.

2. The plasma processing apparatus of claim 1, wherein the electrostatic attracting film is a thermal sprayed film.

3. The plasma processing apparatus of claim 1, wherein the electrostatic attracting film has an annular protrusion to be in contact with the upper surface of the electrode plate and surrounding the plurality of dot-shaped protrusions.

4. The plasma processing apparatus of claim 3, wherein the at least one conductor portion includes a plurality of conductor portions.

5. The plasma processing apparatus of claim 4, wherein the plurality of conductor portions have an annular shape and are arranged concentrically.

6. The plasma processing apparatus of claim 5, wherein the plurality of dot-shaped protrusions include:
a plurality of first dot-shaped protrusions arranged in a first region overlapping a first conductor portion among the plurality of conductor portions in plan view; and
a plurality of second dot-shaped protrusions arranged in a second region overlapping a second conductor portion among the plurality of conductor portions in plan view,
wherein a density of the plurality of second dot-shaped protrusions in the second region is different from a density of the plurality of first dot-shaped protrusions in the first region.

7. The plasma processing apparatus of claim 1, wherein the cooling plate includes a gas diffusion space, a first gas channel extending from an upper surface of the cooling plate to the gas diffusion space, and a plurality of second gas channels extending from the gas diffusion space to the bottom surface of the cooling plate,
the electrode plate has a plurality of gas injection holes communicating with the plurality of second gas channels, and
the plurality of second gas channels are formed at positions that do not overlap the plurality of gas injection holes in plan view.

8. The plasma processing apparatus of claim 1, wherein the dielectric portion is made of at least one of alumina and aluminum nitride.

9. The plasma processing apparatus of claim 7, wherein the gas diffusion space is formed at a position lower than the coolant channel.

10. The plasma processing apparatus of claim 7, wherein the gas diffusion space is formed at a position higher than the coolant channel.

11. The plasma processing apparatus of claim 1, further comprising:

a heater disposed at a peripheral portion of the cooling plate.

12. The plasma processing apparatus of claim 1, further comprising:

a support member configured to support the electrode plate.

13. An upper electrode structure used in a plasma processing device, comprising:

a cooling plate having a coolant channel;

an electrode plate disposed below the cooling plate; and an electrostatic attracting film formed on a bottom surface of the cooling plate and configured to electrostatically attract the electrode plate, the electrostatic attracting film having a dielectric portion and at least one conductor portion disposed in the dielectric portion, wherein the electrostatic attracting film has a plurality of dot-shaped protrusions to be in contact with an upper surface of the electrode plate.

* * * * *